(12) United States Patent
Yu et al.

(10) Patent No.: US 7,911,227 B2
(45) Date of Patent: Mar. 22, 2011

(54) PROGRAMMABLE LOGIC BLOCK OF FPGA USING PHASE-CHANGE MEMORY DEVICE

(75) Inventors: Byoung Gon Yu, Daejeon (KR); Yong-Joo Kim, Uiwang (KR); Sung Min Yoon, Daejeon (KR); Seung-Yun Lee, Daejeon (KR); Young Sam Park, Daejeon (KR); Soonwon Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/633,731

(22) Filed: Dec. 8, 2009

(65) Prior Publication Data

US 2010/0148821 A1 Jun. 17, 2010

(30) Foreign Application Priority Data

Dec. 17, 2008 (KR) ........................ 10-2008-0128624

(51) Int. Cl.
*G06F 7/38* (2006.01)
*H03K 19/173* (2006.01)

(52) U.S. Cl. ............... 326/37; 326/38; 326/40; 326/104
(58) Field of Classification Search ........................ None
See application file for complete search history.

(56) References Cited

U.S. PATENT DOCUMENTS

2006/0028247 A1* 2/2006 Hara et al. ..................... 326/104
2006/0092691 A1* 5/2006 Shiimoto et al. .............. 365/158

* cited by examiner

*Primary Examiner* — Anh Q Tran

(57) ABSTRACT

Provided is a programmable logic block of a field-programmable gate array (FPGA). The programmable logic block includes a pull-up access transistor connected to a power source, an up-phase-change memory device connected to the pull-up access transistor, a down-phase-change memory device connected to the up-phase-change memory device, an output terminal between the up-phase-change memory device and the down-phase-change memory device, and a pull-down access transistor connected to the down-phase-change memory device and a ground. The resistance values of the up-phase-change memory device and the down-phase-change memory device are individually programmed.

19 Claims, 11 Drawing Sheets

| in | sel1 | /sel1 | sel0 | /sel0 |
|---|---|---|---|---|
| 0 | 0 | 1 | 1 | 0 |
| 1 | 1 | 0 | 0 | 1 |

| in2 | in1 | sel3 | /sel3 | sel2 | /sel2 | sel1 | /sel1 | sel0 | /sel0 |
|-----|-----|------|-------|------|-------|------|-------|------|-------|
| 0 | 0 | 0 | 1 | 0 | 1 | 0 | 1 | 1 | 0 |
| 0 | 1 | 0 | 1 | 0 | 1 | 1 | 0 | 0 | 1 |
| 1 | 0 | 0 | 1 | 1 | 0 | 0 | 1 | 0 | 1 |
| 1 | 1 | 1 | 0 | 0 | 1 | 0 | 1 | 0 | 1 |

FIG. 9

| ITEM | NUMBER |
|---|---|
| INPUT | k |
| BASIC CELL | $2^k$ (= n) |
| PHASE CHANGE MEMORY DEVICE | $2*2^k$ |
| OUTPUT SIGNALS OF INPUT/ADDRESS DECODER | $2*2^k$ |

PROGRAMMABLE LOGIC BLOCK OF FPGA USING PHASE-CHANGE MEMORY DEVICE

CROSS-REFERENCE TO RELATED PATENT APPLICATION

This application claims the benefit of Korean Patent Application No. 10-2008-0128624, filed on Dec. 17, 2008, in the Korean Intellectual Property Office, the disclosure of which is incorporated herein in its entirety by reference.

BACKGROUND OF THE INVENTION

1. Field of the Invention

The inventive concept relates to a field-programmable gate array (FPGA), and more particularly, to a programmable logic block of a FPGA.

2. Description of the Related Art

A field-programmable gate array (FPGA) is an electronic component that has a particular function due to its programming by a user even if the function thereof is not fixed when the FPGA is manufactured, and is a kind of programmable logic device (PLD). The FPGA represents reconfigurable large-scale integrated circuits (LSI). In the case of the FPGA, its usage is expanded to portable applications such as digital apparatuses, for example, plasma display panels (PDPs) and liquid-crystal display televisions LCD TVs etc., camcorders, and Blue-ray disks due to continuous development of its performance and reduction in its manufacturing cost.

The FPGA includes a programmable logic block (circuit), for example, a programmable switch device that can program a logic gate or a logic block by the user's programming through an interconnection wire. That is, in the FPGA, a programmable logic block (circuit) as a programmable switch device is included to reconfigure a portion of the LSI circuit. The programmable logic block (circuit) of the FPGA uses a switch circuit that is configured of a static random access memory (SRAM) or a flip-flop and a pass-gate.

The programmable logic block, that is, a switch circuit, not only occupies a significantly large area but also reduces an operation speed due to the increase in parasitic components. Thus, in spite of high manufacturing costs, its application range is very limited. In order to overcome the limitation of the operation speed of the reconfigurable LSI circuit and to reduce the costs for manufacturing chips, it is essential to improve the programmable logic block (circuit).

SUMMARY OF THE INVENTION

The inventive concept provides a programmable logic block (logic circuit) of a field-programmable gate array (FPGA) that greatly reduces development costs of a reconfigurable large-scale integrated (LSI) circuit and improves operational performances, such as, increase in operation speed and reduction of power consumption by securing a very simple structure and a high ON/OFF margin using a phase-change memory device.

According to an aspect of the inventive concept, there is provided a programmable logic block of a field-programmable gate array (FPGA). The programmable logic block may include a pull-up access transistor connected to a power source. An up-phase-change memory device may be connected to the pull-up access transistor. A down-phase-change memory device may be connected to the up-phase-change memory device. An output terminal may be positioned between the up-phase-change memory device and the down-phase-change memory device. A pull-down access transistor may be connected to the down-phase-change memory device and a ground. Resistance values of the up-phase-change memory device and the down-phase-change memory device may be individually programmed.

The programmable logic block of a field-programmable gate array (FPGA) may logically have a value of 0 or 1 by dividing the voltage of the power source through programming the up-phase-change memory device and the down-phase-change memory device to have different resistance values from each other. The pull-up access transistor may be a p-channel metal oxide semiconductor (PMOS) transistor and the pull-down access transistor may be an n-channel metal oxide semiconductor (NMOS) transistor.

According to another aspect of the inventive concept, there is provided a programmable logic block of a FPGA that includes a plurality of basic cells. A single basic cell may include: a pull-up access transistor connected to a power source; an up-phase-change memory device connected to the pull-up access transistor; a down-phase-change memory device connected to the up-phase-change memory device; an output terminal positioned between the up-phase-change memory device and the down-phase-change memory device; and a pull-down access transistor connected to the down-phase-change memory device and a ground.

The programmable logic block of a field-programmable gate array (FPGA) may logically have a value of 0 or 1 by dividing the voltage of the power source through programming the up-phase-change memory device and the down-phase-change memory device to have different resistance values from each other.

An output voltage at the output terminal may display a logic value stored in a single basic cell or may become a high impedance by applying voltages having logic values opposite to each other to gate inputs of the two access transistors of the single basic cell.

The basic cells may be connected together at output terminals, and only one of the basic cells may be activated to output a logic value.

The two basic cells may be connected to each other through an output terminal to constitute an inverter or buffer. The four basic cells may be connected together at an output terminal to constitute a 2-input basic gate such as 2-input AND, OR, XOR, NAND, NOR, or XNOR gates. The $2^k$ basic cells may constitute a k-input combinational logic block by being connected to each other through the output terminals thereof, wherein k is a positive integer.

BRIEF DESCRIPTION OF THE DRAWINGS

The above and other features and advantages of the inventive concept will become more apparent by describing in detail exemplary embodiments thereof with reference to the attached drawings in which:

FIG. 9 is a table quantitatively showing the size of a circuit according to the number of inputs of FIG. 8;

DETAILED DESCRIPTION OF THE INVENTION

Figure 1:
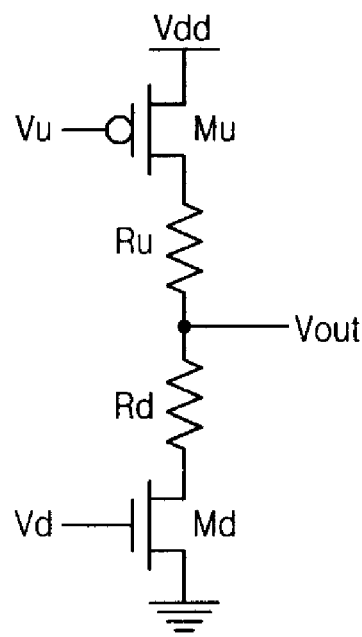
FIG. 1 is a circuit showing a basic cell of a programmable logic block of a FPGA according to an embodiment of the inventive concept.

The present inventive concept will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, like reference numerals denote like elements, and thus their description will be omitted.

A field-programmable gate array (FPGA) includes logic blocks, memory blocks, input/output blocks, and wire channels. The inventive concept provides a programmable logic block of a FPGA using a phase-change (phase change type) memory device that can program two kinds of resistance values, and a method of realizing the programmable logic block of a FPGA. The present inventive concept relates to a programmable logic block of a FPGA. The configurations of the FPGA are well known in the art and thus their description will be omitted. Also, in the inventive concept, the FPGA as a field-programmable logic device is described, however, the present inventive concept can also be used in field-programmable logic devices other than the FPGA.

FIG. 1 is a circuit showing a basic cell of a programmable logic block of a FPGA according to an embodiment of the present inventive concept.

More specifically, resistors Ru and Rd are respectively an up-phase-change (phase change type) memory device and a down phase-change memory device, and for better understanding of the basic cell, circuits that program the resistors Ru and Rd are omitted. The basic cell includes access transistors Mu and Md that are connected to the resistors Ru and Rd, and are a pull-up access transistor and a pull-down access transistor, respectively. The access transistor Mu is a PMOS transistor and the access transistor Md is a NMOS transistor. When both the access transistors Mu and Md are turned off, a current path is not formed, and thus, an output voltage Vout is in a high impedance state.

On the other hand, when both the access transistors Mu and Md are turned on, a current path is formed between a power source voltage Vdd connected to a power source (not shown) and the ground, and thus, the output voltage Vout has an overall constant voltage divided from the power source voltage Vdd to the resistor Rd. The magnitude of the output voltage Vout divided from the power source voltage Vdd to the resistor Rd is expressed as the following Equation 1.

$$Vout = Vdd * Rd/(Ru+Rd) \quad\quad [Equation\ 1]$$

The resistors Ru and Rd are phase-change memory devices and have a resistance value of 700 Kohm in a reset state and 700 ohm in a set state. Since the resistance value difference between the reset state and the set state is approximately 1000 times, almost a complete pull-up and pull-down operation may be achieved according to the state of the resistors Ru and Rd.

Figure 2:
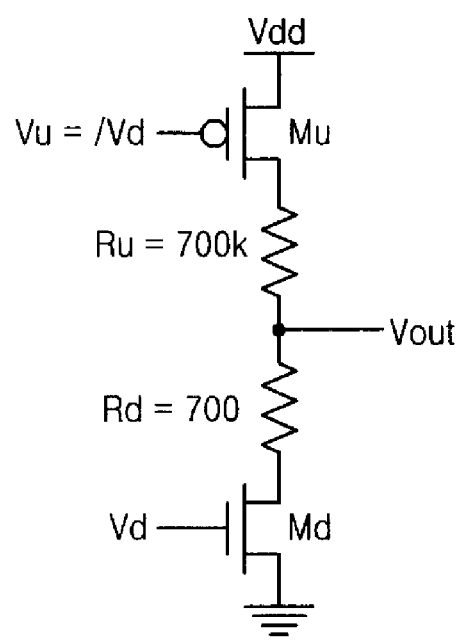
FIGS. 2 and 3 are circuits respectively showing a pull-down operation and a pull-up operation of the basic cell of the programmable logic block of a FPGA of FIG. 1.
Figure 3:
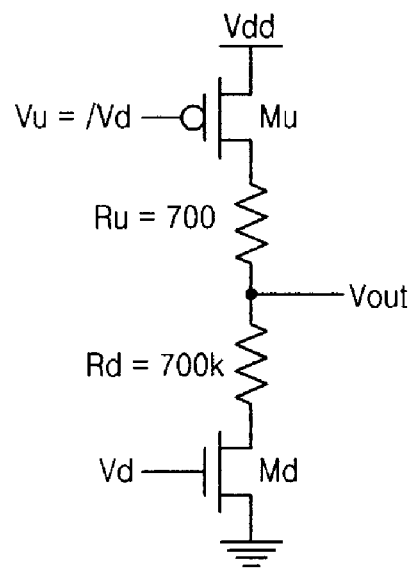

FIGS. 2 and 3 respectively are circuits for explaining a pull-down operation and a pull-up operation of the basic cell of the programmable logic block of a FPGA of FIG. 1.

More specifically, FIGS. 2 and 3 respectively are examples of a pull-down operation and pull-up operation in the basic cell of the programmable logic block of a FPGA by programming the resistors Ru and Rd to have specific resistance values. In FIGS. 2 and 3, a voltage (a gate voltage) Vu being applied to a gate terminal of the access transistor Mu is always a reverse of a voltage Vd (a gate voltage) being applied to a gate of the access transistor Md, and thus, it is indicated in FIGS. 2 and 3 that Vu=/Vd. The reason why always opposite voltages are applied to the access transistors Mu and Md is for only two cases: to form a complete current path by turning on both the access transistors Mu and Md, or to make the output voltage Vout be in a high impedance state through completely removing the current path by turning off both of the access transistors Mu and Md.

The circuit illustrated in FIG. 2 is programmed such that the resistor Ru is in a reset state and the resistor Rd is in a set state. In this programming state, when the resistance values of the resistors Ru and Rd are substituted into Equation 1, a pull-down operation is performed since the output voltage Vout is almost zero volts as shown below.

$$Vout = Vdd*700/(700\ k+700) = 0.001\ Vdd \approx 0V$$

On the other hand, the circuit illustrated in FIG. 3 is programmed such that the resistor Ru is in a set state and the resistor Rd is in a reset state. In this programming state, when the resistance values of the resistors Ru and Rd are substituted into Equation 1, a pull-up operation is performed since the output voltage Vout is almost the power source voltage Vdd as shown below.

$$Vout = Vdd*700\ k/(700\ k+700) = 0.999\ Vdd \approx Vdd$$

As described with reference to FIGS. 1 through 3, the basic cell of the programmable logic block of a FPGA according to the inventive concept has the following important characteristics due to its unique circuit configuration.

First, the basic cell of the programmable logic block of a FPGA functions as a memory cell that logically stores 0 or 1 by programming the two phase-change memory devices to have resistance values different from each other.

Second, an output voltage Vout displays the logic value stored in the basic cell or enters a high impedance state by applying voltages having logic values opposite to each other to the input gates of the two access transistors Mu and Md. As a result, when a programmable logic block is configured by joining basic cells, only a single memory cell is activated, and thus, the voltage value of the single memory cell is displayed as an output voltage.

Third, the normal operation of the programmable logic block of a FPGA that uses a phase-change memory device is a reading operation, that is, reading a value from the phase-change memory device, and the programming operation of the programmable logic block of a FPGA that uses a phase-change memory device is a writing operation, that is, writing a value in the phase-change memory device.

Figure 4A:
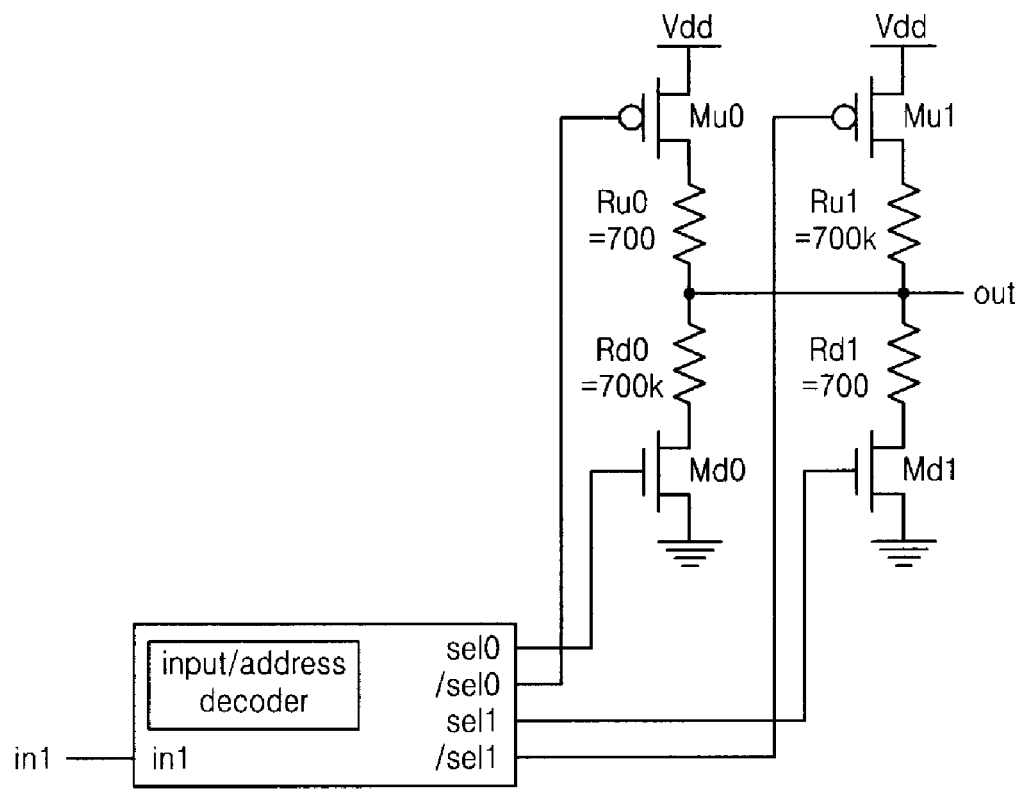
FIG. 4A shows an inverter circuit configured using two basic cells of a programmable logic block of a FPGA, according to an embodiment of the inventive concept.
Figures 4B, 5:
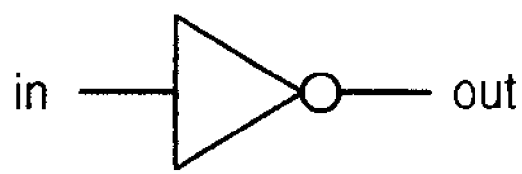
FIG. 4B is shows equivalent logic circuit of the inverter circuit of FIG. 4A, according to embodiments of the inventive concept.
FIG. 5 is a truth table showing the operation of address/input decoder of FIG. 4A.

FIG. 4A shows an inverter circuit configured using two basic cells of a programmable logic block of a FPGA according to an embodiment of the inventive concept. FIG. 4B is shows equivalent logic circuit of the inverter circuit of FIG. 4A, according to embodiments of the inventive concept. FIG. 5 is a truth table showing the operation of an address/input decoder of FIG. 4A.

More specifically, FIG. 4A is an inverter circuit configured using two basic cells of the programmable logic block of a FPGA. FIG. 4B is an equivalent logic circuit of the inverter circuit of FIG. 4A. The operation that the programmable logic block functions as a logic circuit block corresponds to a reading operation, that is, reading memory data from the basic cell. In order to read the memory data from the basic cell, a corresponding memory cell must be selected by decoding a memory address input. The input signal (In) of the logic circuit becomes an address input signal to the corresponding memory cell.

In FIG. 4A, the address/input decoder is a decoder that selects a memory cell by decoding an input signal inx (x is an integer, for example 1). In this circuit, the first cell is programmed to logic 1 and the second cell is programmed to logic 0. The input signal (in1) is transformed to four selection signals by being decoded in the address/input decoder and is applied to the two basic cells. The seln (n is an integer, for example 0 or 1) is signal for selecting Mun or Mdn (n is an integer, for example 0 or 1). The /seln is an inverted value of seln (n is an integer, for example 0 or 1).

When a logic value of 0 is applied to the input in1, as shown in FIG. 5, sel0=1, /sel0=0, sel1=0, and /sel1=1, and the first cell is activated, and thus, a stored value of 1 is outputted. When a logic value of 1 is applied to the in1, as shown in FIG. 5, sel0=0, /sel0=1, sel1=1, and /sel1=0, and the second cell is activated, and thus, a stored value of 0 is outputted. That is, if the input is 0, the output is 1, and, if the input is 1, the output is 0, and thus, an invert operation is performed.

Figure 6A:
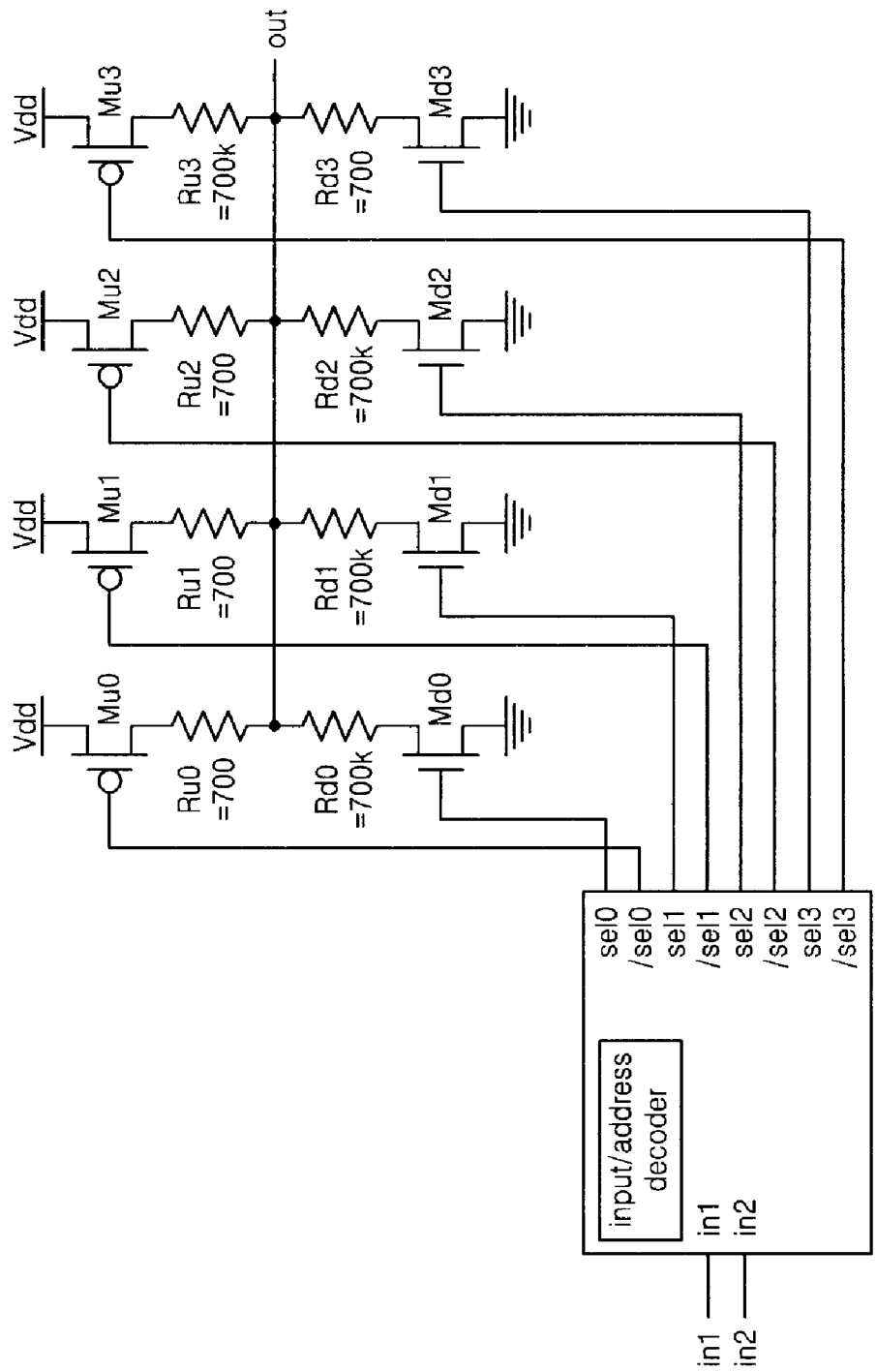
FIGS. 6A and 6B show a two-input NAND gate configured using four basic cells of a programmable logic block of a FPGA, according to an embodiment of the inventive concept.
Figures 6B, 7:
FIG. 7 is a truth table showing the operation of an address/input decoder of FIG. 6A.

FIG. 6A shows a two-input NAND gate configured using four basic cells of a programmable logic block of a FPGA, according to an embodiment of the inventive concept. FIG. 6B shows an equivalent logic circuit of the two-input NAND gate of FIG. 6A, according to an embodiment of the inventive concept. FIG. 7 is a truth table showing the operation of an address/input decoder of FIG. 6A.

More specifically, the four basic cells constitute a 2-input basic gate such as 2-input AND, OR, XOR, NAND, NOR, or XNOR gates by being connected to each other through the output terminals thereof. Here, as an example, the two-input NAND gate is configured using four basic cells of the programmable logic block of a FPGA. FIG. 6B is an equivalent logic circuit of the two-input NAND gate of FIG. 6A. In the circuit of FIG. 6A, only the fourth cell is programmed to logic 0, and the rest of the cells are programmed to logic 1. An input signal (in0 and in1) is transformed to eight selection signals by being decoded in an address/input decoder and is applied to the four basic cells. Referring to FIG. 7, in the truth table, /seln (n is an integer, for example 0, 1, 2 or 3) is an inverted signal of seln.

When a logic value 1 is inputted to the in2 and in1, sel3, /sel3, sel2, /sel2, sel1, /sel1, sel0, /sel0=10010101, and the fourth cell is activated, and thus, a stored value 0 is outputted. With respect to the rest of the input values (00, 01, and 10), one of the first through third cells are activated, and thus, a stored value 1 is outputted. That is, the output voltage is 0 when the input value is 11, 1 when 00, 01, or 10, and thus, a 2-input NAND operation is performed.

Figure 8:
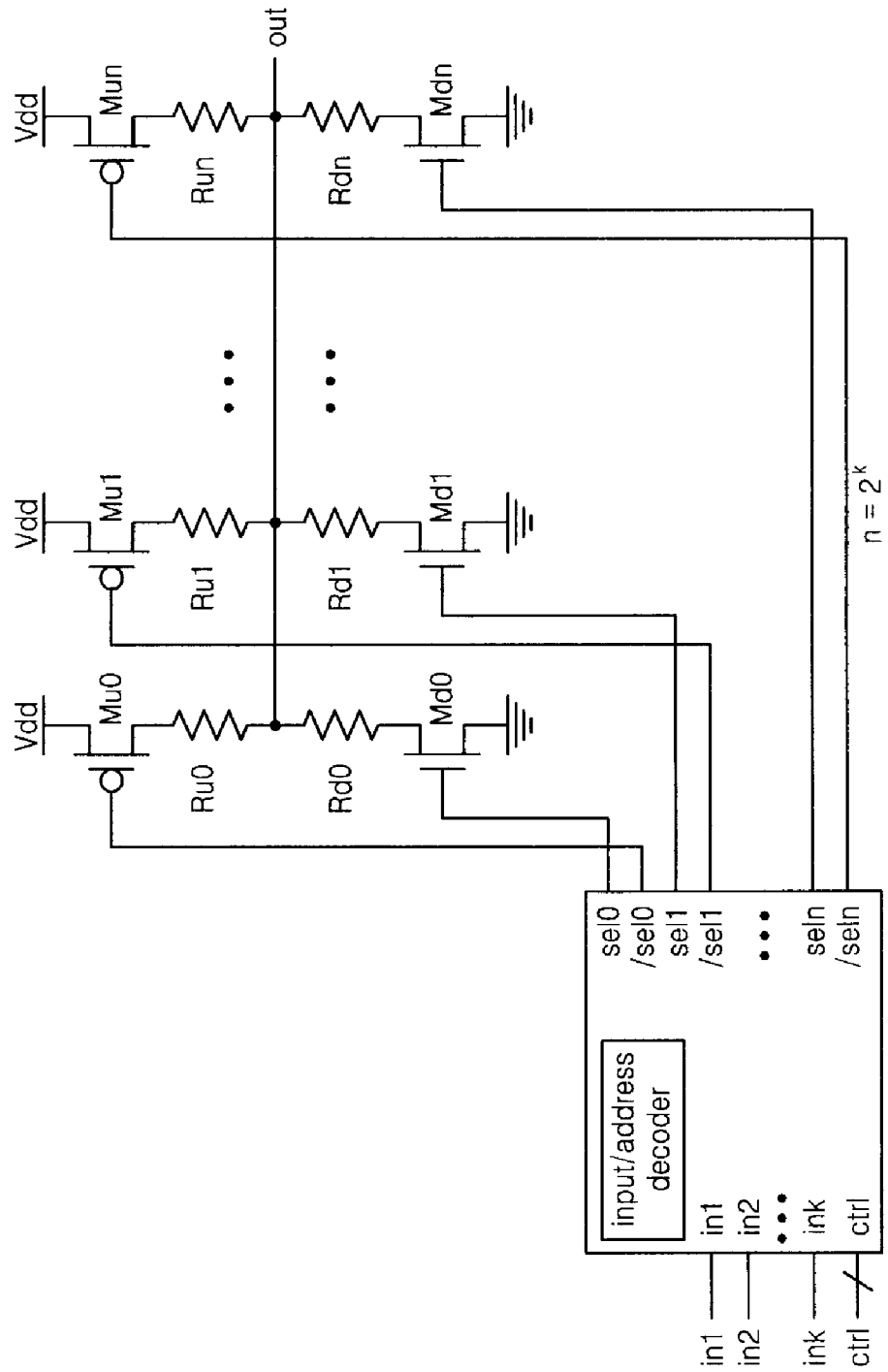
FIG. 8 illustrates a generalized programmable logic block of a FPGA, according to an embodiment of the inventive concept.

FIG. 8 illustrates a generalized programmable logic block of a FPGA according to an embodiment of the inventive concept. FIG. 9 is a table quantitatively showing the size of a circuit according to the number of inputs of FIG. 8.

More specifically, FIG. 8 is a typical programmable logic block showing an arbitrary k-input combinational logic functions. The circuit shows that control signals (indicated as ctrl) may be added, besides the input signals. The size of the circuit is proportional to $2^k$ (k is a positive integer) when the number of input signal (In) is k. The $2^k$ is n where n is the number of selection signal. In FIG. 9, the size of the circuit according to the number of inputs is quantitatively shown.

Up to now, in order to describe the function of the programmable logic block of a FPGA, the description of a writing circuit required for memory cell programming was omitted. Hereinafter, a programmable logic block of a FPGA that includes the writing circuit will now be described.

Figure 10A:
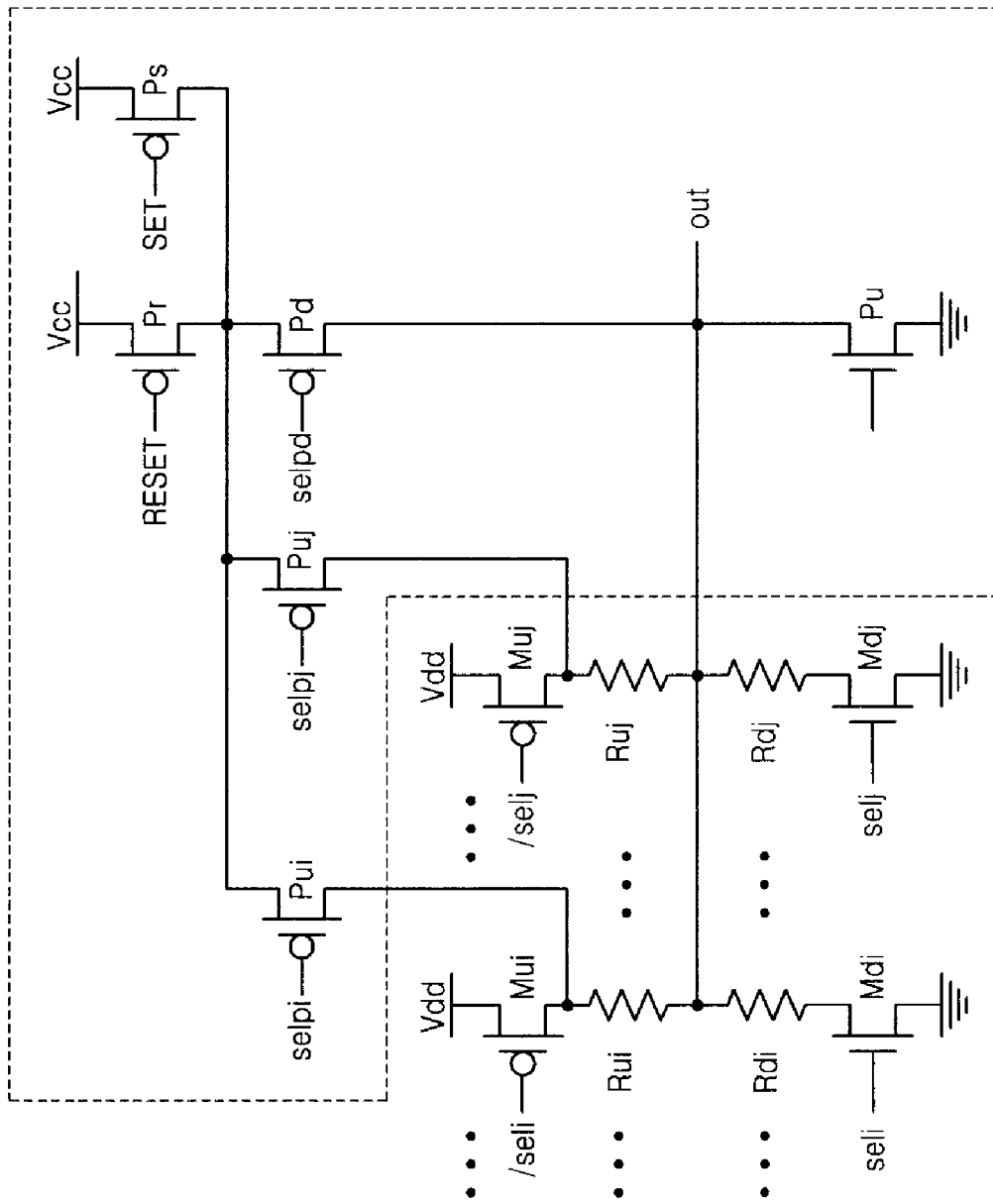
FIG. 10A is a circuit showing a configuration of a complete programmable logic block of a FPGA that includes a writing (programming) circuit, according to an embodiment of the inventive concept.
Figure 10B:
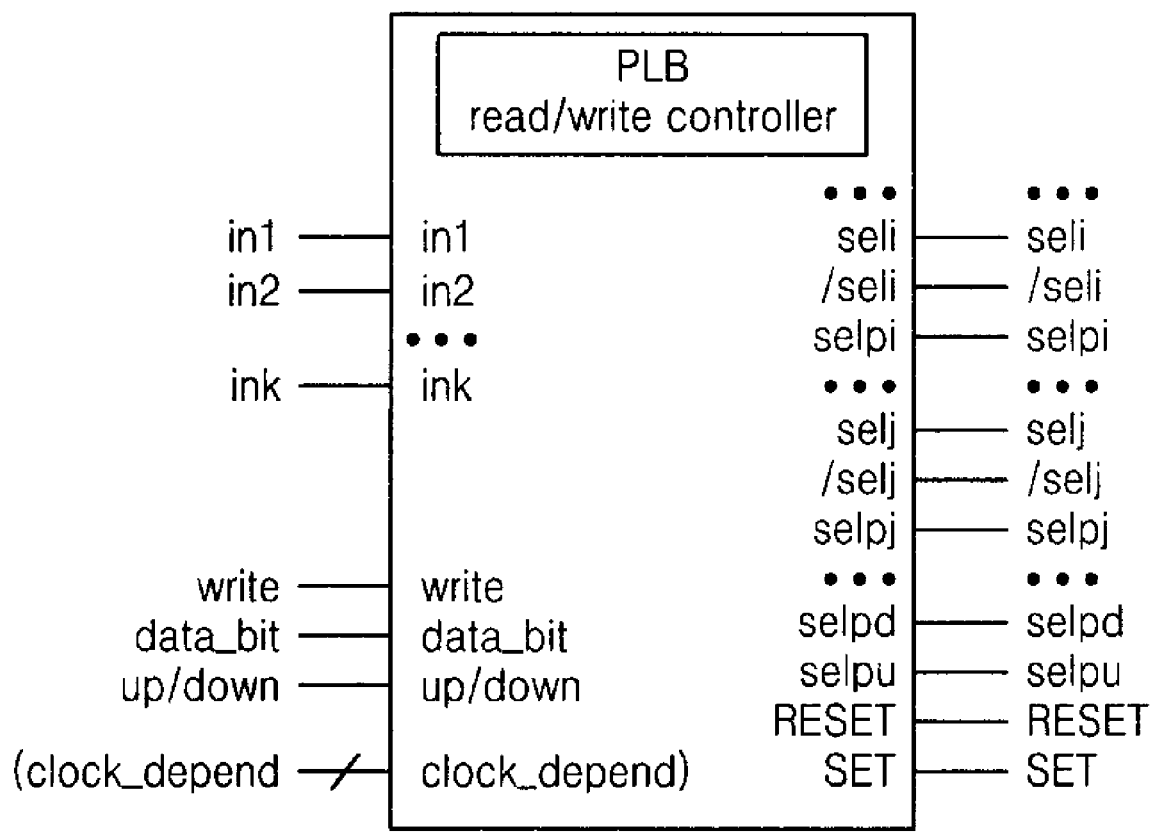
FIG. 10B shows an arrangement of the read/write controller of programmable logic block of the FPGA of FIG. 10A.

FIG. 10A is a circuit showing a configuration of a complete programmable logic block of a FPGA that includes a writing circuit, according to an embodiment of the inventive concept. FIG. 10B shows an arrangement of the read/write controller of programmable logic block of the FPGA of FIG. 10A.

More specifically, in FIG. 10A, the writing circuit is shown within the dash lines. Vcc is a power source voltage of the writing circuit. Pu, Pui, Puj and Pd are access transistors, and Pr and Ps are driving transistors in the writing circuit. In FIG. 10B, a reading/writing controller for completely controlling the operation of the complete programmable logic block, that is, both writing and reading data of the complete programmable logic block, is shown. The reading/writing controller of the complete programmable logic block of FIG. 10B includes the functions of the input/address decoder described above and further includes the following signals and functions corresponding to the signals.

Added functions are: the input of data bit information (data_bit signal), that is, a data bit information input required for writing; the input of the location of a phase-change memory device to be programmed (up/down signal), that is, a up/down input; the input of whether writing or reading (write signal), that is, a write input; the generation of adequate timing according to signals dependent to various clock signals (clock_depend signals), that is, a clock depend inputs; and writing circuit driving signals, that is, selpi, selpj, selpd, selpu, reset, and set.

Figure 11:
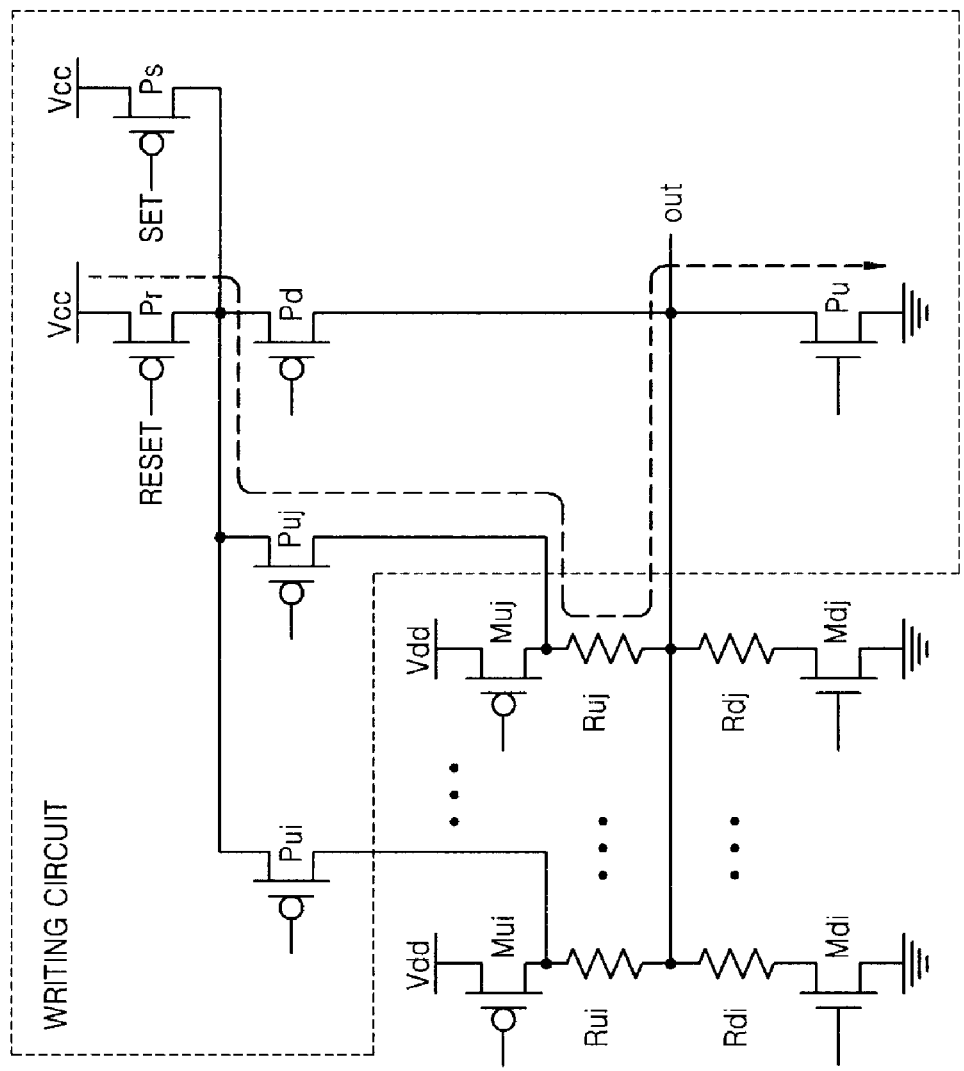
FIGS. 11 and 12 are circuits for explaining the writing (programming) operation of a programmable logic block of a FPGA according to an embodiment of the inventive concept.
Figure 12:
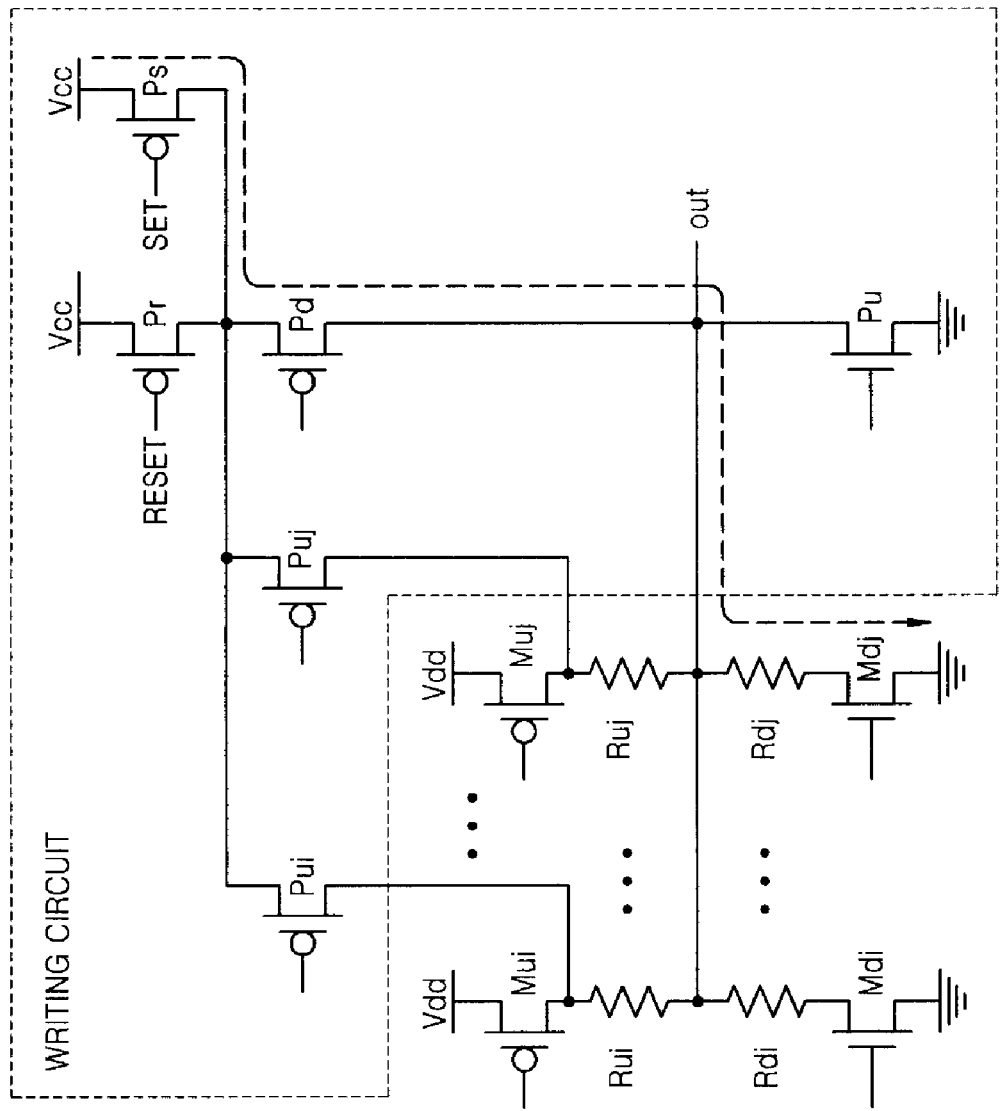

FIGS. 11 and 12 are circuits for explaining the writing operation of a programmable logic block of a FPGA according to an embodiment of the inventive concept.

More specifically, the writing circuit is shown within the dash lines. Vcc is a power source voltage of the writing circuit. Pu, Pui, Puj and Pd are access transistors, and Pr and Ps are driving transistors in the writing circuit. FIG. 11 is a circuit showing a writing operation of the resistor Ruj in a reset state as an example of a writing operation in the programmable logic block.

In FIG. 11, in order to write to a resistor Ruj, a current path indicated by long dash lines must be formed and an amount of current that can maintain a reset state must be applied for a period of time through the current path. All transistors positioned outside the current path must be turned off.

FIG. 12 is a circuit showing a writing operation of the resistor Rdj in a set state as an example of writing operation in the programmable logic block. In FIG. 12, in order to write to a resistor Rdj, a current path indicated by long dash lines must be formed and the amount of current that can be maintained in a set state must be applied for a period of time through the current path. All transistors positioned outside the current path must be turned off.

The programmable logic block of a FPGA according to the inventive concept has a very simple structure by using a phase change memory device, reduces the development costs of the reconfigurable LSI circuit by securing a high ON/OFF margin, and improves operational performances, such as, increase in operation speed and reduction of power consumption. In this way, not only the market of the reconfigurable LSI circuit including the programmable logic block of a FPGA, so far the applicable range thereof was very limited, can be remarkably increased but also new applicable markets can be created in the future. Thus, a new paradigm of next generation electronic part field can be formed.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A programmable logic block of a field-programmable gate array (FPGA) comprising:
   a pull-up access transistor connected to a power source;
   an up-phase-change memory device connected to the pull-up access transistor;
   a down-phase-change memory device connected to the up-phase-change memory device;
   an output terminal between the up-phase-change memory device and the down-phase-change memory device; and
   a pull-down access transistor connected to the down-phase-change memory device and a ground,
   wherein the programmable logic block of a FPGA is configured to individually program a resistance value of each of the up-phase-change memory device and the down-phase-change memory device.

2. The programmable logic block of a FPGA of claim 1, wherein the programmable logic block of a FPGA logically has a value of 0 or 1 by dividing the voltage of the power source through programming the up-phase-change memory device and the down-phase-change memory device to have different resistance values from each other.

3. The programmable logic block of a FPGA of claim 1, wherein the pull-up access transistor is a p-channel metal-oxide semiconductor (PMOS) transistor and the pull-down access transistor is an n-channel metal-oxide semiconductor (NMOS) transistor.

4. A programmable logic block of a field-programmable gate array (FPGA) configured of a plurality of basic cells, wherein a single basic cell comprises:
   a pull-up access transistor connected to a power source;
   an up-phase-change memory device connected to the pull-up access transistor;
   a down-phase-change memory device connected to the up-phase-change memory device;
   an output terminal between the up-phase-change memory device and the down-phase-change memory device; and
   a pull-down access transistor connected to the down-phase-change memory device and a ground,
   wherein $2^k$ basic cells constitute a k-input combinational logic block by being connected to each other through output terminals thereof, k being a positive integer.

5. The programmable logic block of the FPGA of claim 4, wherein an output voltage outputted from each output terminal displays a logic value stored in a single basic cell or enters a high impedance state by applying voltages having logic values opposite to each other to gate-inputs of the pull-up and pull-down access transistors of the single basic cell.

6. The programmable logic block of the FPGA of claim 4, wherein the basic cells are connected together at their output terminals, and only one of the basic cells is activated to output a logic value.

7. The programmable logic block of the FPGA of claim 4, wherein two basic cells constitute an inverter by being connected to each other through output terminals thereof.

8. The programmable logic block of the FPGA of claim 4, wherein four basic cells constitute a 2-input basic gate such as 2-input AND, OR, XOR, NAND, NOR, or XNOR gates by being connected to each other through output terminals thereof.

9. The programmable logic block of the FPGA of claim 1, further comprising:
   a set current driving unit to provide a set current to the up-phase-change and down-phase-change memory devices;
   a reset current driving unit to provide a reset current to the up-phase-change and down-phase-change memory devices;
   a first access unit coupled between the set and reset current driving units and the up-phase-change memory device;
   a second access unit coupled between the set and reset current driving units and the down-phase-change memory device; and
   a third access unit coupled between a ground and a common node of the up-phase-change memory device and the down-phase-change memory device,
   wherein the set and reset currents are separately provided to the up-phase-change memory device and the down-phase-change memory device in response to operations of the first to third access units.

10. The programmable logic block of the FPGA of claim 9, wherein the up-phase-change memory device is programmed through a first current path including one of the set and reset current providing units, the first access unit, the up-phase-change memory device and the third access unit.

11. The programmable logic block of the FPGA of claim 10, wherein the down-phase-change memory device is programmed through a second current path including the other one of the set and reset current providing units, the second access unit, the down-phase-change memory device and the pull-down access transistor.

12. The programmable logic block of the FPGA of claim 9, wherein the set and reset current driving units comprise p-channel metal-oxide semiconductor (PMOS) transistors operating in response to set and reset control signals, respectively.

13. The programmable logic block of the FPGA of claim 9, wherein the first and second access units comprise p-channel metal-oxide semiconductor (PMOS) transistors, and the third access unit comprises a n-channel metal-oxide semiconductor (NMOS) transistor.

14. The programmable logic block of the FPGA of claim 4, wherein the pull-up access transistor is a p-channel metal-oxide semiconductor (PMOS) transistor and the pull-down access transistor is an n-channel metal-oxide semiconductor (NMOS) transistor.

15. The programmable logic block of the FPGA of claim 4, wherein the programmable logic block of the FPGA logically has a value of 0 or 1 by dividing a voltage of the power source through programming the up-phase-change memory device and the down-phase-change memory device to have different resistance values from each other.

16. The programmable logic block of the FPGA of claim 4, wherein the resistance values of the up-phase-change memory device and the down-phase-change memory device are individually programmed.

17. The programmable logic block of the FPGA of claim 16, further comprising:
   a set current driving unit to provide a set current to the up-phase-change and down-phase-change memory devices;
   a reset current driving unit to provide a reset current to the up-phase-change and down-phase-change memory devices;
   a second access unit coupled between the set and reset current driving units and the down-phase-change memory device; and
   a third access unit coupled between a ground and a common node of the up-phase-change memory device and the down-phase-change memory device,
   wherein each basic cell further comprises:
   a first access unit coupled between the set and reset current driving units and the up-phase-change memory device, and
   wherein the set and reset currents are separately provided to the up-phase-change memory device and the down-phase-change memory device of said basic cell in response to operations of the first to third access units.

18. The programmable logic block of the FPGA of claim 17, wherein the up-phase-change memory device of the basic cell is programmed through a first current path including one of the set and reset current providing units and the first access unit, the up-phase-change memory device and the third access unit.

19. The programmable logic block of the FPGA of claim 18, wherein the down-phase-change memory device of the basic cell is programmed through a second current path including the other one of the set and reset current providing units and the second access unit, the down-phase-change memory device and the pull-down access transistor.

* * * * *